United States Patent [19]
Cheek et al.

[11] Patent Number: 6,124,610
[45] Date of Patent: *Sep. 26, 2000

[54] ISOTROPICALLY ETCHING SIDEWALL SPACERS TO BE USED FOR BOTH AN NMOS SOURCE/DRAIN IMPLANT AND A PMOS LDD IMPLANT

[75] Inventors: Jon D. Cheek, Round Rock; Derick J. Wristers; Anthony J. Toprac, both of Austin, all of Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/105,872

[22] Filed: Jun. 26, 1998

[51] Int. Cl.⁷ .................................................. H01L 29/72
[52] U.S. Cl. .......................... 257/328; 257/336; 257/344
[58] Field of Search .................................... 257/344, 336, 257/328; 438/184, 185

[56] References Cited

U.S. PATENT DOCUMENTS

| | | |
|---|---|---|
| 4,172,260 | 10/1979 | Okabe et al. . |
| 4,222,062 | 9/1980 | Trotter et al. . |
| 4,356,623 | 11/1982 | Hunter . |

(List continued on next page.)

FOREIGN PATENT DOCUMENTS

| | | |
|---|---|---|
| 58-137255 | 8/1983 | Japan . |
| 62-200757 | 9/1987 | Japan . |
| 63-161660 | 7/1988 | Japan . |
| 2-280342 | 11/1990 | Japan . |
| 3-41773 | 2/1991 | Japan . |
| 4-85968 | 3/1992 | Japan . |
| 4-171730 | 6/1992 | Japan . |
| 4-208571 | 7/1992 | Japan . |
| 5-75115 | 3/1993 | Japan . |
| 5-129325 | 5/1993 | Japan . |
| 5-267327 | 10/1993 | Japan . |
| 6-216151 | 8/1994 | Japan . |

OTHER PUBLICATIONS

Wolf, et al., *Silicon Processing for the VLSI Era, Vol. 1: Process Technology*, Lattice Press 1986, p. 183.
Ghandi, Sorab "VLSI Fabrication Principles and Gallium Arsenide," Second Edition, John Wiley and Sons, Inc. pp. 510, 514–517, 535–537 and 576–577.
Wolf, Stanley, "Silicon Processing for the VLSI era, Vol. 1,: Process Technology," Lattice Press, pp. 280–300.
Streetman, *Solid State Electronic Devices*, Prentice–Hall, Inc., 1995, pp. 319–321.
Patent Abstracts of Japan, Publication No. 06216151, published Aug. 5, 1994.
International Search Report for Application No. PCT/US99/03135 mailed Jun. 15, 1999.

*Primary Examiner*—Edward Wojciechowicz
*Attorney, Agent, or Firm*—Conley, Rose & Tayon, P.C.; Robert C. Kowert; Kevin L. Daffer

[57] ABSTRACT

A method is provided for isotropically etching pairs of sidewall spacers to reduce the lateral thickness of each sidewall spacer. In an embodiment, first and second pairs of sidewall spacers are concurrently formed upon the opposed sidewall surfaces of respective first and second gate conductors. The first and second gate conductors are spaced laterally apart upon isolated first and second active areas of a semiconductor substrate, respectively. Advantageously, a single set of sidewall spacer pairs are used as masking structures during the formation of source and drain regions of an NMOS transistor and LDD areas of a PMOS transistor. That is, the n source/drain ("S/D") implant is self-aligned to the outer lateral edge of the first pair of sidewall spacers prior to reducing the lateral thicknesses of the sidewall spacers. However, the p⁻ LDD implant is self-aligned to the outer lateral edge of the second pair of sidewall spacers after the spacer thicknesses have been reduced. Therefore, multiple pairs of sidewall spacers need not be formed laterally adjacent the sidewall surfaces of the gate conductors to vary the spacing between the implant regions and the gate conductors of the ensuing integrated circuit.

16 Claims, 5 Drawing Sheets

U.S. PATENT DOCUMENTS

| | | |
|---|---|---|
| 4,463,491 | 8/1984 | Goldman et al. . |
| 4,638,347 | 1/1987 | Iyer . |
| 4,652,897 | 3/1987 | Okuyama et al. . |
| 4,672,419 | 6/1987 | McDavid . |
| 4,737,828 | 4/1988 | Brown . |
| 4,788,663 | 11/1988 | Tanaka et al. . |
| 4,818,714 | 4/1989 | Haskell . |
| 4,818,715 | 4/1989 | Chao . |
| 4,835,112 | 5/1989 | Pfiester et al. . |
| 4,843,023 | 6/1989 | Chiu et al. . |
| 4,868,617 | 9/1989 | Chiao et al. . |
| 4,949,136 | 8/1990 | Jain ........................................ 357/23.3 |
| 4,951,100 | 8/1990 | Parillo . |
| 4,952,825 | 8/1990 | Toshida . |
| 4,968,639 | 11/1990 | Bergonzoni . |
| 4,971,922 | 11/1990 | Watabe et al. . |
| 4,994,404 | 2/1991 | Sheng et al. . |
| 4,994,869 | 2/1991 | Matloubian et al. . |
| 5,015,598 | 5/1991 | Verhaar . |
| 5,091,763 | 2/1992 | Sanchez . |
| 5,119,152 | 6/1992 | Mizuno .................................. 357/23.3 |
| 5,153,145 | 10/1992 | Lee et al. . |
| 5,168,072 | 12/1992 | Moslehi . |
| 5,216,268 | 6/1993 | Chen et al. . |
| 5,221,632 | 6/1993 | Kurimoto et al. . |
| 5,241,203 | 8/1993 | Hsu et al. . |
| 5,254,866 | 10/1993 | Ogoh ........................................ 257/369 |
| 5,258,319 | 11/1993 | Inuishi et al. . |
| 5,274,261 | 12/1993 | Chen . |
| 5,278,441 | 1/1994 | Kang et al. . |
| 5,286,664 | 2/1994 | Horiuchi . |
| 5,296,401 | 3/1994 | Mitsui et al. . |
| 5,324,974 | 6/1994 | Liao . |
| 5,332,914 | 7/1994 | Hazani . |
| 5,334,870 | 8/1994 | Katada et al. . |
| 5,341,003 | 8/1994 | Obinata . |
| 5,369,297 | 11/1994 | Kusunoki et al. . |
| 5,371,394 | 12/1994 | Ma et al. . |
| 5,386,133 | 1/1995 | Hiroki et al. . |
| 5,405,791 | 4/1995 | Ahmad et al. . |
| 5,422,506 | 6/1995 | Zamapian . |
| 5,424,234 | 6/1995 | Kwon . |
| 5,432,106 | 7/1995 | Hong . |
| 5,444,282 | 8/1995 | Yamaguchi et al. . |
| 5,460,993 | 10/1995 | Hsu et al. . |
| 5,470,773 | 11/1995 | Liu et al. . |
| 5,473,184 | 12/1995 | Murai . |
| 5,477,070 | 12/1995 | Nam . |
| 5,480,814 | 1/1996 | Wuu et al. . |
| 5,482,880 | 1/1996 | Kaya . |
| 5,493,130 | 2/1996 | Dennison et al. . |
| 5,498,555 | 3/1996 | Lin . |
| 5,501,997 | 3/1996 | Lin et al. . |
| 5,510,279 | 4/1996 | Chien et al. . |
| 5,510,284 | 4/1996 | Yamauchi . |
| 5,512,771 | 4/1996 | Hiroki et al. . |
| 5,516,707 | 5/1996 | Loh et al. . |
| 5,545,578 | 8/1996 | Park et al. . |
| 5,547,885 | 8/1996 | Ogoh . |
| 5,565,369 | 10/1996 | Ko . |
| 5,576,556 | 11/1996 | Takemura et al. . |
| 5,580,804 | 12/1996 | Joh . |
| 5,583,067 | 12/1996 | Sanchez . |
| 5,602,045 | 2/1997 | Kimura . |
| 5,607,869 | 3/1997 | Yamazaki . |
| 5,608,240 | 3/1997 | Kumagai . |
| 5,629,220 | 5/1997 | Yang . |
| 5,654,215 | 8/1997 | Gardner et al. . |
| 5,656,518 | 8/1997 | Gardner et al. . |
| 5,663,586 | 9/1997 | Lin . |
| 5,677,224 | 10/1997 | Kadosh et al. . |
| 5,696,019 | 12/1997 | Chang . |
| 5,705,439 | 1/1998 | Chang . |
| 5,710,450 | 1/1998 | Chau et al. . |
| 5,719,425 | 2/1998 | Akram et al. .......................... 257/344 |
| 5,739,573 | 4/1998 | Kawaguchi . |
| 5,741,736 | 4/1998 | Orlowski et al. . |
| 5,747,373 | 5/1998 | Yu . |
| 5,757,045 | 5/1998 | Tsai et al. . |
| 5,766,969 | 6/1998 | Fulford, Jr. et al. . |
| 5,789,780 | 8/1998 | Fulford, Jr. et al. . |
| 5,793,089 | 8/1998 | Fulford, Jr. et al. . |
| 5,837,572 | 11/1998 | Gardner et al. . |
| 5,846,857 | 12/1998 | Ju . |
| 5,847,428 | 12/1998 | Fulford, Jr. et al. . |
| 5,851,866 | 12/1998 | Son ........................................ 438/231 |
| 5,869,866 | 2/1999 | Fulford, Jr. et al. . |
| 5,869,879 | 2/1999 | Fulford, Jr. et al. . |
| 5,882,973 | 3/1999 | Gardner et al. . |
| 5,895,955 | 4/1999 | Gardner et al. . |
| 5,898,202 | 4/1999 | Fulford, Jr. et al. .................... 257/408 |
| 5,900,666 | 5/1999 | Gardner et al. . | ing steps which may be used to form a CMOS circuit in
ISOTROPICALLY ETCHING SIDEWALL SPACERS TO BE USED FOR BOTH AN NMOS SOURCE/DRAIN IMPLANT AND A PMOS LDD IMPLANT

BACKGROUND OF THE INVENTION

1. Field of the Invention

This invention relates to integrated circuit fabrication and, more particularly, to isotropically etching sidewall spacers formed upon the opposed sidewall surfaces of a pair of CMOS (one NMOS and one PMOS) gate conductors to reduce the lateral thickness of each spacer. The sidewall spacers are isotropically etched after performing a source/drain implant self-aligned to the pair of sidewall spacers arranged upon the NMOS gate conductor so that they may also be used to perform an LDD implant self-aligned to the pair of sidewall spacers arranged upon the PMOS gate conductor.

2. Description of the Related Art

Fabrication of a MOSFET device is well known. Generally speaking, MOSFETs are manufactured by placing an undoped polycrystalline ("polysilicon") material over a relatively thin gate oxide. The polysilicon material is then patterned to form a gate conductor directly above a channel region of the substrate. A dopant species is implanted into the gate conductor and regions of the substrate exclusive of the channel region, thereby forming source and drain regions (i.e., junctions) adjacent to and on opposite sides of the channel region. If the dopant species used for forming the source and drain regions is n-type, then the resulting MOSFET is an NMOSFET ("n-channel") transistor device. Conversely, if the dopant species is p-type, then the resulting MOSFET is a PMOSFET ("p-channel") transistor device. Integrated circuits utilize either n-channel devices exclusively, p-channel devices exclusively, or a combination of both (CMOS) on a single substrate. While both types of devices can be formed, the devices are distinguishable based on the dopant species used.

As device dimensions continue to shrink, transistor devices become more sensitive to so-called short-channel effects ("SCE"). The distance between a source-side junction and a drain-side junction is often referred to as the physical channel length. However, after implantation and subsequent diffusion of the junctions, the actual distance between junctions becomes less than the physical channel length and is often referred to as the effective channel length ("Leff"). In VLSI designs, as the physical channel becomes small, so too must the Leff. SCE becomes a predominant problem whenever Leff drops below approximately 0.2 μm.

Generally speaking, SCE impacts device operation by, inter alia, reducing device threshold voltages and increasing sub-threshold currents. As Leff becomes quite small, the depletion regions associated with the source and drain areas within the junctions may extend toward one another and substantially occupy the channel area. Henceforth, some of the channel will be partially depleted without any influence of gate voltage. As a result, less gate charge is required to invert the channel of a transistor having a short Leff. Somewhat related to threshold voltage lowering is the concept of sub-threshold current flow. Even at times when the gate voltage is below the threshold value, current between the source and drain nonetheless exists for transistors having a relatively short Leff. One method in which to control SCE is to increase the dopant concentration within the body of the device. Unfortunately, increasing dopant within the body deleteriously increases potential gradients in the device.

In addition to promoting SCE, reducing device dimensions may cause the lateral electric field in MOS devices to increase, giving rise to so-called hot carrier effects ("HCE"). HCE is a phenomena in which the kinetic energy of charged carriers (holes or electrons) within the channel region of a device is increased as the carriers are accelerated through large potential gradients. As a result of this increase in kinetic energy, the charged carriers are injected into the gate oxide wherein they may become trapped. The greatest potential gradient, often referred to as the maximum electric field ("Em") occurs near the drain during saturated operation. As a result of electron entrapment within the gate oxide, a net negative charge density forms in the gate oxide. The trapped charge can accumulate with time, resulting in a positive threshold shift in an NMOS transistor, or a negative threshold shift in a PMOS transistor, To overcome the problems related to SCE and HCE, an alternative drain structure known as the lightly doped drain ("LDD") is commonly used. The purpose of the LDD is to absorb some of the potential into the drain and thus reduce Em. A conventional LDD structure is one in which a light concentration of dopant is self-aligned to the gate conductor followed by a heavier concentration of dopant self-aligned to the gate conductor on which a pair of sidewall spacers has been formed. The purpose of the first implant dose is to produce lightly doped sections within an active area of the substrate near the channel. The second implant dose is spaced from the channel by a distance substantially equivalent to the thickness of each sidewall spacer. The second implant dose forms heavily doped source and drain regions within the active area laterally outside the LDD areas. In this manner, the lateral thickness of each sidewall spacer dictates the length of each LDD area.

Unfortunately, lateral migration of dopant species within both the source and drain regions and the LDD areas of a PMOS transistor can offset the benefits of having those LDD areas. P-type dopant species, e.g., boron, are typically relatively small in size. As such, the p-type dopant species easily diffuse through interstitial and vacancy positions within the substrate to other sections of the substrate in response to being heated during subsequent processing steps. As a result of dopant diffusion, the source and drain regions may eventually extend completely to the gate conductor while the LDD areas may extend partially underneath the gate conductor. The lateral migration of dopant species into the channel region reduces the Leff of the transistor, and thus may lead to detrimental SCE and HCE. Thus, it may be of benefit to unconventionally displace the PMOS LDD areas away from the gate conductor to provide protection against SCE and HCE.

FIGS. 1–4 illustrate a conventional sequence of processing steps which may be used to form a CMOS circuit in which the LDD areas of a PMOS transistor are laterally offset from the sidewalls surfaces of a corresponding gate conductor. FIG. 1 depicts a partial cross-sectional view of a single crystalline silicon substrate 10 which is slightly doped with n-type dopant species. Shallow trench isolation structures 14 laterally isolate active areas 6 and 8 of substrate 10. A p-type well 12 resides within an upper portion of active area 6 between a pair of isolation structures 14. A pair of gate conductors 22 are spaced above separate active areas of substrate 10 by a gate dielectric 20. For example, three pairs of sidewall spacers 24a, 24b, and 24c may be formed laterally adjacent the opposed sidewall surfaces of each gate conductor 22. Sidewall spacers 24a and 24c are typically composed of a dielectric, i.e., silicon dioxide, which is dissimilar to the dielectric, i.e., silicon nitride, from which sidewall spacers 24b are made. As such, each of the sidewall spacers 24a, 24b, and 24c may be selectively etched without removing the adjacent spacer. As shown in FIG. 1, a masking layer 26 may be formed upon active area 6 and the sidewall spacers and the gate conductor 22 residing above active area 6. Subsequent to forming masking layer 26, a p$^+$ source/drain implant self-aligned to the exposed lateral edges of sidewall spacers 24c is forwarded into the unmasked areas of substrate 10 to from source and drain regions 28.

After removing masking layer 26, sidewall spacers 24c are removed from sidewall spacers 24b using an etch technique which is highly selective to silicon dioxide ("oxide") relative to silicon nitride ("nitride"). Another masking layer 30 is formed upon active area 8 and the structures overlying the active area, as shown in FIG. 2. Thereafter, an n$^+$ source/drain implant self-aligned to the exposed lateral edges of sidewall spacers 24b is performed to form source and drain regions 32 within well 12. Absent sidewall spacers 24c, source and drain regions 32 are placed such that they are closer to the adjacent gate conductor 22 than are source and drain regions 28. Subsequently, masking layer 30 is removed from active area 8, and sidewall spacers 24b are removed from sidewall spacers 24a using an etch technique which exhibits a high etch selectivity ratio of nitride to oxide. After forming a masking layer 34 upon active area 6 and the structures overlying active area 6, a p$^-$ LDD implant is performed. In this manner, LDD areas 36 are formed within active area 8 laterally aligned to the exposed lateral edges of sidewall spacers 24a, immediately adjacent to source and drain regions 28.

As shown in FIG. 4, sidewall spacers 24a and masking layer 34 may then be removed, followed by the formation of a masking layer 38 upon active area 8 and the overlying gate conductor 22. An n$^-$ LDD implant which is self-aligned to the opposed sidewall surfaces of the unmasked gate conductor 22 is forwarded into well 12 to form LDD areas 40. An NMOS transistor 42 and a PMOS transistor 44 are thusly placed upon and within substrate 10. Although source and drain regions 28 and LDD areas 36 of PMOS transistor 46 may include high-diffusing dopant species, initially placing them a spaced distance from gate conductor 22 reduces the possibility that they might migrate laterally underneath the gate conductor.

The process of forming three pairs of sidewall spacers laterally adjacent each gate conductor, sequentially removing each pair of spacers, and masking certain active areas while implanting dopants into other active areas is unfortunately very time consuming. First of all, since sidewall spacers 24a and 24c are composed of oxide while sidewall spacer 24b is composed of nitride, a separate deposition and anisotropic etch step is required for each spacer. Further, each time an implantation step is performed, one mask is removed from certain active areas while another mask is formed across other active areas. Also, since a different pair of spacers is selectively etched before each implantation step, time must be allotted for the preparation of each etch process and each implantation process. It would therefore be desirable to reduce the number of processing steps, and hence the amount of time required to form a CMOS circuit in which the junctions of the PMOS transistors are laterally spaced from adjacent gate conductors while those of the NMOS transistors are positioned immediately adjacent the gate conductors.

SUMMARY OF THE INVENTION

The problems outlined above are in large part solved by the technique hereof for isotropically etching pairs of sidewall spacers to reduce the lateral thickness of each sidewall spacer. In an embodiment, first and second pairs of sidewall spacers are concurrently formed upon the opposed sidewall surfaces of respective first and second gate conductors. The first and second gate conductors are spaced laterally apart upon isolated first and second active areas of a semiconductor substrate, respectively. Advantageously, a single set of sidewall spacer pairs are used as masking structures during the formation of source and drain regions of an NMOS transistor and LDD areas of a PMOS transistor. That is, the n$^+$ source/drain ("S/D") implant is self-aligned to the outer lateral edge of the first pair of sidewall spacers prior to reducing the lateral thicknesses of the sidewall spacers. However, the p$^-$ LDD implant is self-aligned to the outer lateral edge of the second pair of sidewall spacers after the spacer thicknesses have been reduced. Therefore, multiple pairs of sidewall spacers need not be formed laterally adjacent the sidewall surfaces of the gate conductors to vary the spacing between the implant regions and the gate conductors of the ensuing integrated circuit.

Prior to fabricating the sidewall spacers, an n$^-$ LDD implant which is self-aligned to the opposed sidewall surfaces of the first gate conductor is forwarded into the first active area. As such, the LDD areas of the PMOS transistor are displaced from the corresponding gate conductor while the LDD areas of the NMOS transistor are positioned immediately adjacent the corresponding gate conductor. Subsequent to performing the p$^-$ LDD implant, third and fourth pairs of sidewall spacers are formed laterally extending from the first and second pairs of sidewall spacers, respectively. A p$^+$ S/D implant is then self-aligned to the exposed lateral edges of the fourth pair of sidewall spacers, thereby forming source and drain regions within the second active area. The combined lateral thickness of adjacent first and third spacers is substantially greater than the original lateral thickness of each individual third spacer. Accordingly, the source and drain regions of the PMOS transistor are laterally spaced from the second gate conductor by a distance that is substantially greater than the distance by which the source and drain regions of the NMOS transistor are spaced from the first gate conductor.

Removing the graded junctions (i.e., source and drain regions and LDD areas) of the PMOS transistor away from the second gate conductor gives the dopant species some leeway between the junctions and the channel region of the substrate beneath the gate conductor. Absent the additional spacing between the PMOS junctions and the second gate conductor, the relatively fast-diffusing p-type dopant species, e.g., boron, could inadvertently migrate into the channel region, and thus reduce the Leff of the PMOS transistor. As such, displacing the PMOS junctions from the second gate conductor lowers the risk of SCE and HCE. Advantageously, fewer steps are required to form the CMOS transistor in which the PMOS junctions are displaced from their corresponding gate conductor by a greater distance than the NMOS junctions are displaced from their corresponding gate conductor. In particular, only two pairs of sidewall spacers are formed upon the sidewall surfaces of each gate conductor. As such, the deposition time and anisotropic etch time required to form a third spacer is eliminated. Also, it is not necessary to remove one spacer from another spacer to achieve the desired junction configuration. Accordingly, less time is required to fabricate the transistor devices which are substantially resistant to HCE and SCE. Therefore, the overall throughput of the integrated circuit manufacturer is increased by reducing the lateral thicknesses of a single set of sidewall spacer pairs so that they may be used for both an n$^+$ S/D implant and a p$^-$ LDD implant.

According to an embodiment, a semiconductor substrate is provided which includes a first active area laterally isolated from a second active area by an isolation structure. A first gate conductor and a second gate conductor have been patterned laterally spaced apart upon respective first and second active areas. The first and second gate conductors are spaced above the substrate by a gate dielectric and are laterally bounded by respective first and second opposed sidewall surfaces. A first masking layer is formed upon the second active area and the second gate conductor, followed by forwarding an n$^-$ LDD implant self-aligned to the first opposed sidewall surfaces into the first active area. The first masking layer is removed, and the first and second pairs of sidewall spacers are then formed laterally extending from the respective first and second opposed sidewall surfaces. Preferably the sidewall spacers comprise a dielectric, e.g., oxide or nitride. A second masking layer is then patterned upon the second active area, the second pair of sidewall spacers, and the second gate conductor. Subsequently, an n$^+$ S/D implant of n-type dopants, e.g., arsenic, is forwarded into first source and drain regions of the first active area which are spaced from the first gate conductor by the first pair of sidewall spacers. The n$^+$ S/D implant is performed at a higher dose and energy than the n$^-$ LDD implant so that the resulting first source and drain regions contain a higher dopant concentration than the resulting first LDD areas. An NMOS transistor is thus formed upon and within the first active area.

After removing the second masking layer from the semiconductor topography, the first and second pairs of sidewall spacers are isotropically etched using, e.g., a plasma etch chemistry which readily removes the spacer material. In this manner, the lateral thickness of each sidewall spacer is reduced. Thereafter, a third masking layer is formed upon the first active area, the first pair of sidewall spacers, and the first gate conductor. A p$^-$ implant is then performed to incorporate p-type dopants, e.g., boron, into regions of the second active area spaced from the second gate conductor by the second pair of sidewall spacers having the reduced thicknesses. The third masking layer is removed so that third and fourth pairs of sidewall spacers may be formed upon the first and second pairs of sidewall spacers, respectively. As such, the third pair of sidewall spacers extend laterally from first outer edges that laterally bound the first pair of sidewall spacers to third outer edges that laterally bound the third pair of sidewall spacers. Also, the fourth pair of sidewall spacers extend laterally from second outer edges that laterally bound the second pair of sidewall spacers to fourth outer edges that laterally bound the fourth pair of sidewall spacers.

After patterning a masking layer upon the first active area, the first and third pairs of sidewall spacers, and the first gate conductor, a p$^+$ implant performed at a higher dose and energy than the p$^-$ implant is forwarded into second source and drain regions of the second active area. The second source and drain regions are laterally spaced from the second gate conductor by the second and fourth pairs of sidewall spacers. The second LDD areas of the resulting PMOS transistor are arranged within the second active area, approximately aligned between the second and fourth outer edges of the second and fourth pairs of sidewall spacers, respectively. The second source and drain regions are positioned within the second active area immediately adjacent to the second LDD areas. On the other hand, the first LDD areas of the NMOS transistor reside within the first active area, approximately aligned to the first opposed sidewall surfaces of the first gate conductor. The outer lateral edges of the first LDD areas are interposed between, and laterally displaced from, the first and third outer edges of the first and third pairs of sidewall spacers, respectively. The first source and drain regions are arranged within the first active area beside the first LDD areas.

BRIEF DESCRIPTION OF THE DRAWINGS

Other objects and advantages of the invention will become apparent upon reading the following detailed description and upon reference to the accompanying drawings in which.

Figure 1:
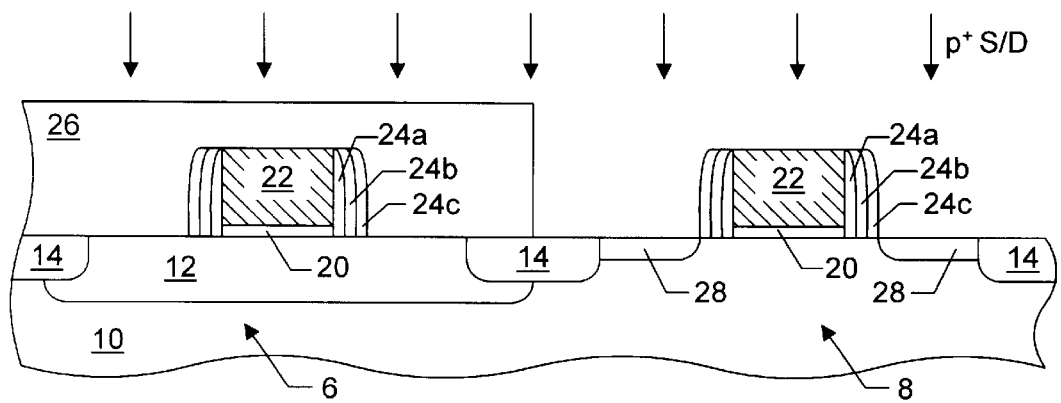
FIGS. 1–4 depict a cross-sectional view of a sequence of conventional processing steps used to form a CMOS integrated circuit, wherein three pairs of sidewall spacers are employed to form graded junctions of transistor devices.
Figure 2:
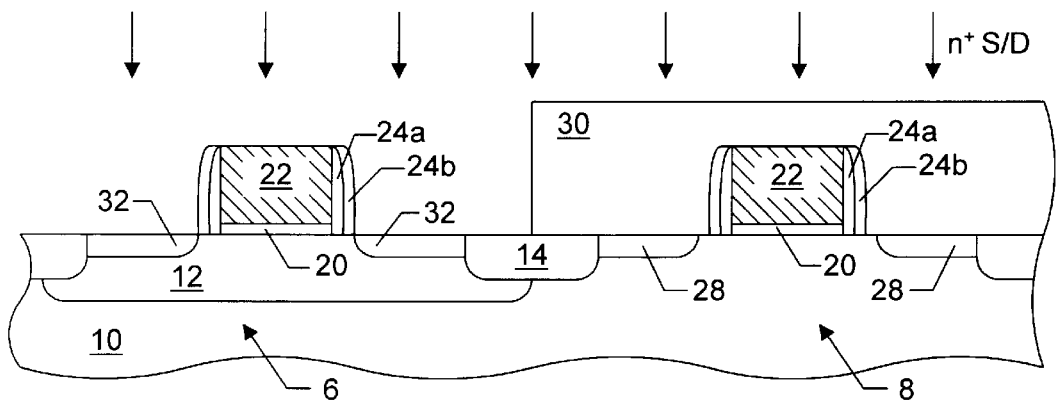
Figure 3:
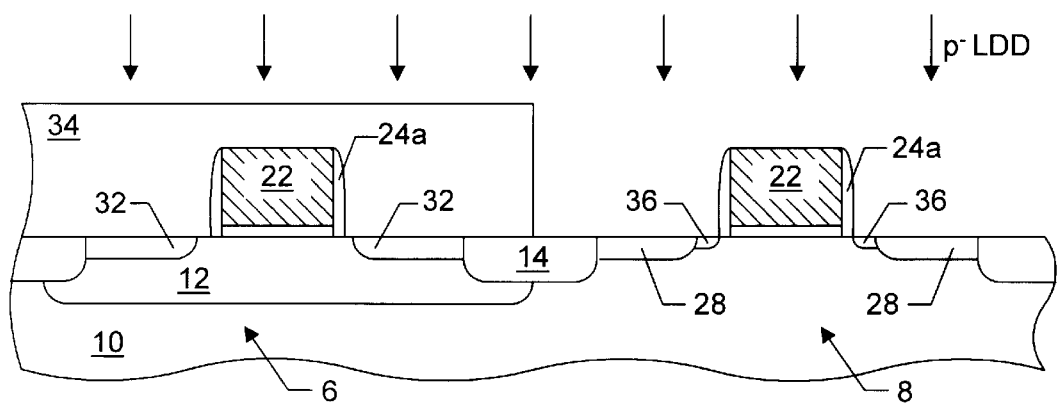
Figure 4:
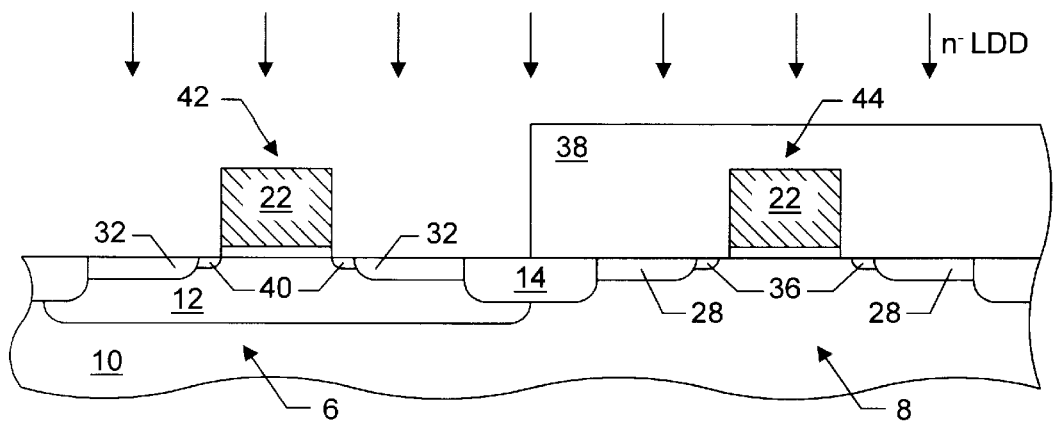

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 5:
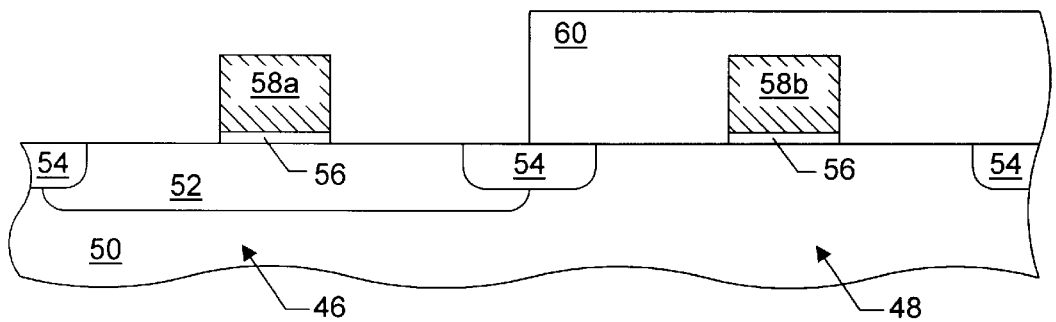
FIG. 5 depicts a partial cross-sectional view of a semiconductor topography in which first and second gate conductors are arranged upon respective first and second active areas of a semiconductor substrate, wherein a first masking layer is formed upon the second active area and the second gate conductor.

Turning now to FIG. 5, a partial cross-sectional view of a semiconductor substrate 50 is depicted. Substrate 50 preferably comprises single crystalline silicon which has been slightly doped with n-type impurities. Substrate 50 includes first and second active areas 46 and 48 which are isolated from each other and from other active areas within substrate 50 by well-known shallow trench isolation structures 54. Alternatively, trench isolation structures 50 may be replaced with well-known LOCOS structures. A p-type well 52 has been formed within an upper portion of first active area 46 using ion implantation of p-type species therein. In an alternate embodiment, bulk substrate 50 may be slightly doped with p-type impurities, and an n-type well may be arranged within active area 48. A pair of gate conductors 58a and 58b have been patterned a lateral spaced distance apart upon first and second active areas 46 and 48, respectively. Gate conductors 58a and 58b may comprise, e.g., polysilicon which has been chemically-vapor deposited from a silane source. A gate dielectric 56 comprising, e.g., oxide, is interposed between substrate 50 and each gate conductor. As shown in FIG. 5, a masking layer 60 is patterned across active area 48 and gate conductor 58b which leaves well 52 and gate conductor 58a uncovered. Masking layer 60 may comprise, e.g., photoresist which is patterned using optical lithography.

Figure 6:
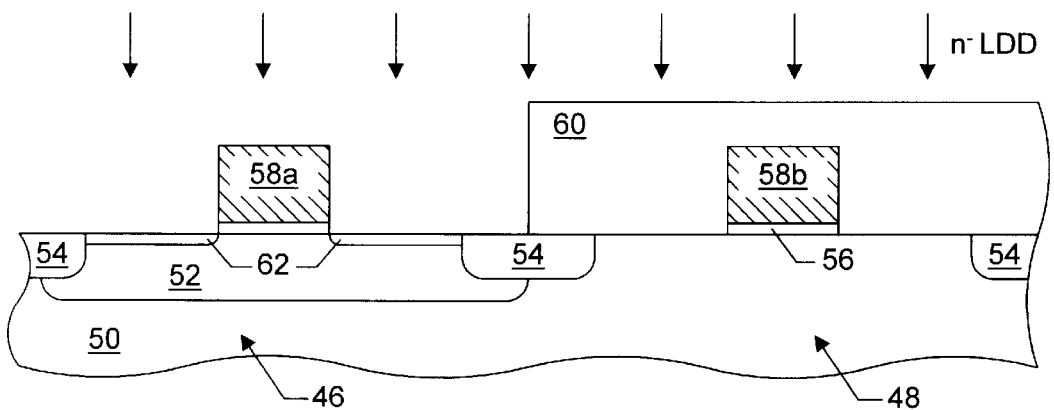
FIG. 6 depicts a partial cross-sectional view of the semiconductor topography, wherein an n$^-$ LDD implant forwarded into the first active area is self-aligned to the first opposed sidewall surfaces of the first gate conductor, subsequent to the step in FIG. 5.
Figure 7:
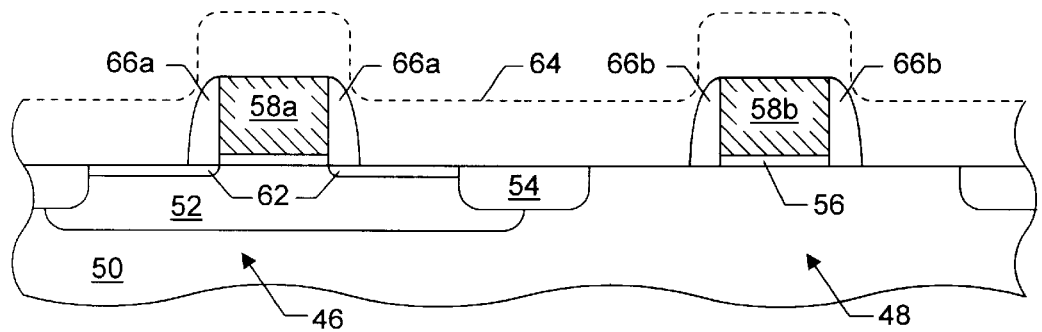
FIG. 7 depicts a partial cross-sectional view of the semiconductor topography, wherein first and second pairs of sidewall spacers are formed upon respective first and second opposed sidewall surfaces which bound the first and second gate conductors, respectively, subsequent to the step in FIG. 6.

Turning to FIG. 6, subsequent to forming masking layer 60, an n⁻ LDD implant is forwarded into areas 62 of p-type well 52 which are not masked by gate conductor 58a. Appropriate n-type dopant species for the LDD implant include arsenic and phosphorus. FIG. 7 illustrates the formation of first and second pairs of sidewall spacers 66a and 66b laterally extending from the opposed sidewall surfaces of respective first and second gate conductors 58a and 58b. Masking layer 60 is stripped from active area 48 prior to spacer formation. Sidewall spacers 66a and 66b may be formed by first depositing a spacer material, e.g., oxide or nitride, across the semiconductor topography, as indicated by dotted line 64. Thereafter, the spacer material is anisotropically etched such that ion ablation of horizontally oriented surfaces occurs at a faster rate than ion ablation of vertically oriented surfaces. The etch preferably terminates before substantial portions of substrate 50 and gate conductor 58 can be removed. Using the anisotropic etch allows the spacer material to be retained upon the sidewall surfaces of gate conductors 58a and 58b in the form of sidewall spacers 66a and 66b.

Figure 8:
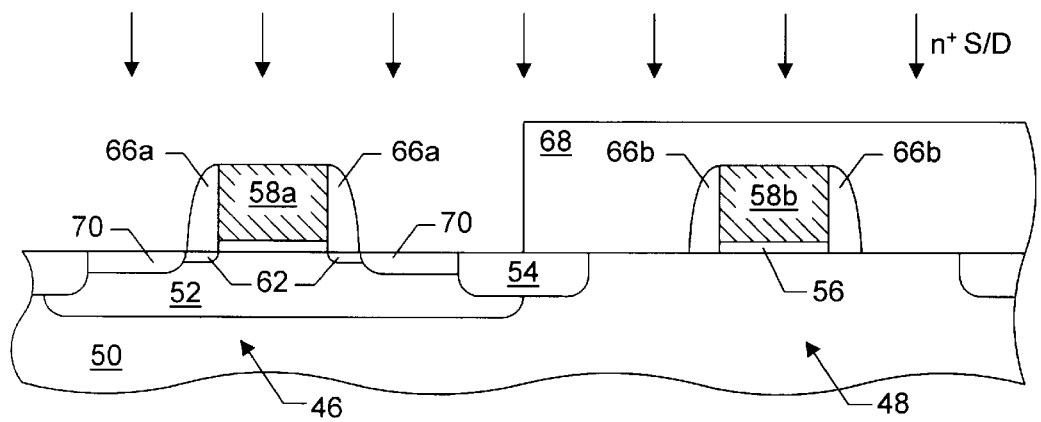
FIG. 8 depicts a partial cross-sectional view of the semiconductor topography, wherein a second masking layer is formed upon the second active area, and an n$^+$ implant forwarded into the first active area is self-aligned to the exposed lateral edges of the first pair of spacers, subsequent to the step in FIG. 7.
Figure 9:
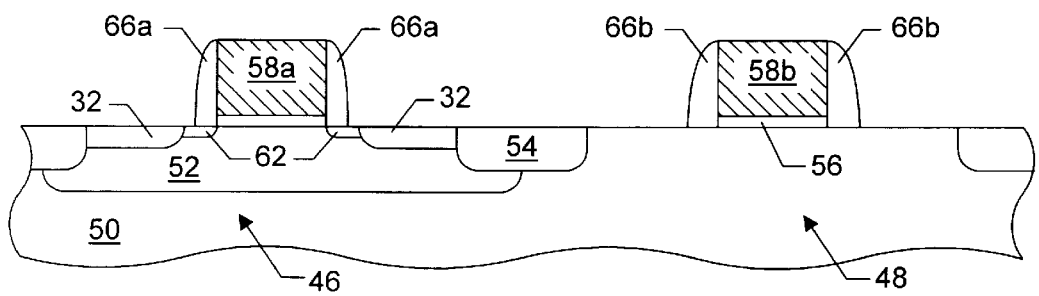
FIG. 9 depicts a partial cross-sectional view of the semiconductor topography, wherein the first and second pairs of sidewall spacers are isotropically etched to reduce the lateral thickness of each spacer after removing the second masking layer from the second active area, subsequent to the step in FIG. 8.
Figure 10:
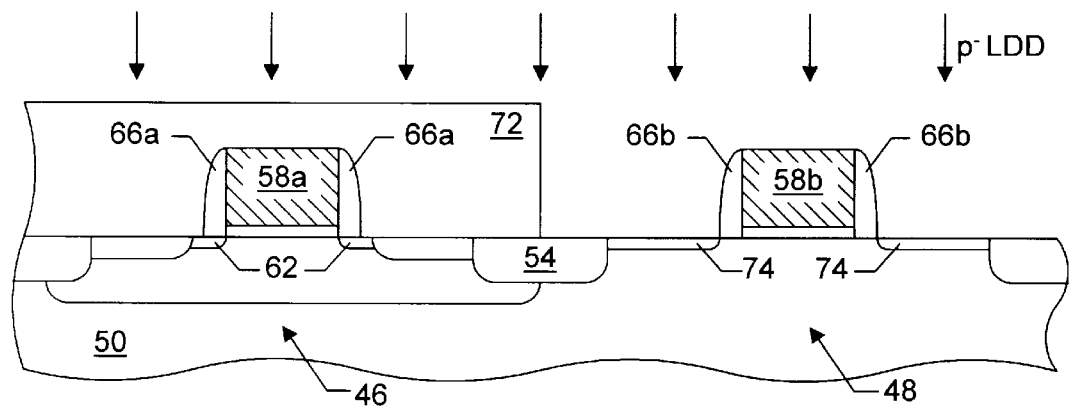
FIG. 10 depicts a partial cross-sectional view of the semiconductor topography, wherein a third masking layer is formed upon the first active area, and wherein a p$^-$ LDD implant forwarded into the second active area is self-aligned to the exposed lateral edges of the second pair of sidewall spacers, subsequent to the step in FIG. 9.

Turning to FIG. 8, a masking layer 68 comprising, e.g., photoresist, is then patterned upon active area 48 of substrate 50, sidewall spacers 66b, and gate conductor 58b. Thereafter, an n⁺ S/D implant of n-type dopant species are forwarded into source and drain regions 70 of well 52 which are displaced from gate conductor 58a by a distance substantially equivalent to the lateral thickness of each sidewall spacer 66a. The n⁺ S/D implant is performed at a higher dose and energy than is the n⁻ LDD implant. Source and drain regions 70 dominate a substantial portion of the previously implanted areas 62 such that LDD areas 62 become primarily positioned beneath sidewall spacers 66a. Subsequently, as depicted in FIG. 9, masking layer 68 is removed, and sidewall spacers 66a and 66b are concurrently isotropically etched to reduce their lateral thicknesses. A plasma etch technique which exhibits a high selectivity to the spacer material relative to silicon may, for example, be used. As shown in FIG. 10, a masking layer 72 comprising, e.g., photoresist, is then patterned upon active area 46, gate conductor 58a, and sidewall spacers 66a. A p⁻ LDD implant is forwarded into areas 74 of active area which are laterally spaced from gate conductor 58b by a distance substantially equivalent to the reduced lateral thickness of each sidewall spacers 66b. Appropriate ptype dopant species from the implant include boron and boron difluoride.

Figure 11:
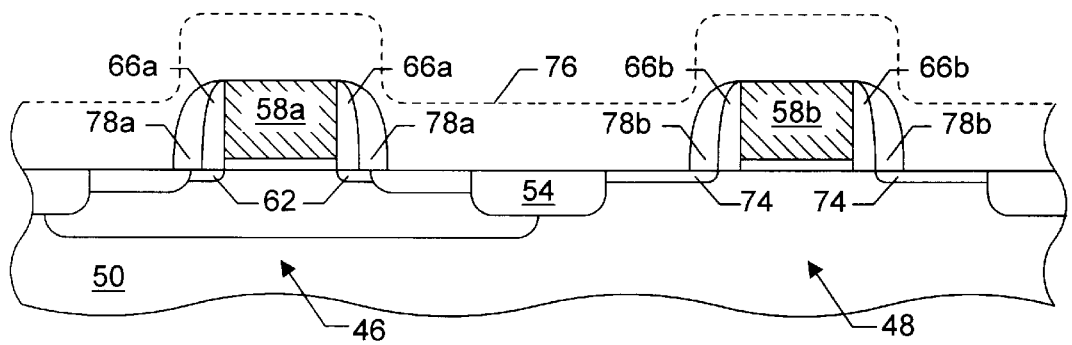
FIG. 11 depicts a partial cross-sectional view of the semiconductor topography, wherein third and fourth pairs of sidewall spacers are formed laterally extending from respective first and second sidewall spacers, subsequent to the step in FIG. 10.
Figure 12:
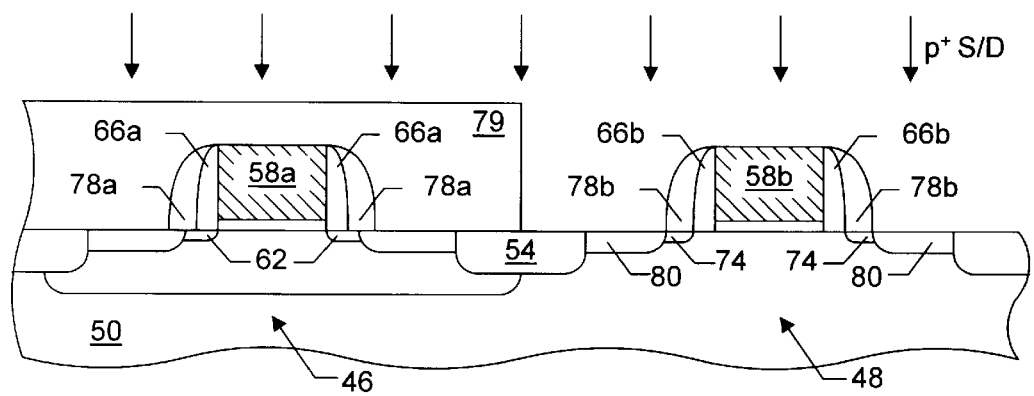
FIG. 12 depicts a partial cross-sectional view of a semiconductor topography, wherein a fourth masking layer is formed upon the first active area, and wherein a p$^+$ LDD implant forwarded into the second active area is self-aligned to the exposed lateral edges of the fourth pair of sidewall spacers, subsequent to the step in FIG. 11.
Figure 13:
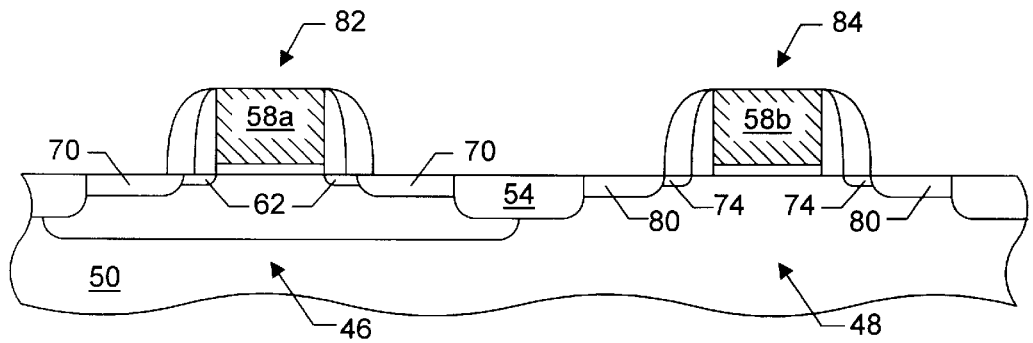
FIG. 13 depicts a partial cross-sectional view of a semiconductor topography, wherein the fourth masking layer is removed from the first active area to complete the formation of NMOS and PMOS transistors, subsequent to the step in FIG. 12.

Turning to FIG. 11, masking layer 72 is removed and third and fourth pairs of sidewall spacers 78a and 78b are formed laterally extending from respective first and second pairs of sidewall spacers 66a and 66b. Formation of sidewall spacers 78a and 78b involves depositing a spacer material, e.g., oxide or nitride, across the topography, as represented by dotted line 76, followed by anisotropically etching the spacer material. Thereafter, as shown in FIG. 12, a masking layer 79 comprising, e.g., photoresist is patterned upon active area 46, gate conductor 58a, and sidewall spacers 66a and 78a. A p⁺ S/D implant is then performed to incorporate a relatively high concentration of p-type dopant species into source and drain regions 80 of active area 48 which are displaced from gate conductor 58b by a distance substantially equivalent to the combined lateral thicknesses of spacers 66b and 78b. The p⁺ S/D implant is performed at a higher dose and energy than the p⁻ LDD implant. FIG. 13 depicts the semiconductor topography after masking layer 79 has been removed from active area 46. An NMOS transistor 82 and a PMOS transistor 84 result from the sequence of steps shown in FIGS. 5–13. An ensuing CMOS integrated circuit employing NMOS transistor 82 and PMOS transistor 84 may be formed using well-known semiconductor fabrication techniques.

It will be appreciated to those skilled in the art having the benefit of this disclosure that this invention is believed to provide a method for isotropically etching pairs of sidewall spacers to reduce the lateral thickness of each sidewall spacer. Accordingly, the pre-etch thickness of the sidewall spacers may be used as masking structures for a S/D implant of an NMOS transistor while the post-etch thickness of the spacers may be used as masking structures for an LDD implant of a PMOS transistor. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An integrated circuit comprising:
    first and second gate conductors laterally spaced apart and dielectrically spaced above respective first and second active areas of a semiconductor substrate, wherein the first and second gate conductors are interposed between respective first and second opposed sidewall surfaces;
    first and second pairs of sidewall spacers extending laterally from the respective first and second opposed sidewall surfaces to respective first and second outer edges;

third and fourth pairs of sidewall spacers extending laterally from the first and second outer edges, respectively, to respective third and fourth outer edges;

a first pair of lightly doped drain areas residing within the first active area, wherein each of the first pair of lightly doped drain areas is formed aligned with one of said first opposed sidewall surfaces of said first gate conductor;

first source and drain regions arranged within the first active area laterally adjacent the first lightly doped drain areas, wherein the first source and drain regions are formed aligned at a point between the third outer edges and the first outer edges; and a second pair of lightly doped drain areas residing within the second active area, wherein each of the second pair of lightly doped drain areas is formed aligned with the second outer edge of one of the second pair of sidewall spacers.

2. The integrated circuit of claim 1, wherein the first pair of lightly doped drain areas comprise a first concentration of n-type dopant species.

3. The integrated circuit of claim 1, wherein the second pair of lightly dope drain areas comprise a first concentration of p-type dopant species.

4. The integrated circuit of claim 3, wherein the first active area and the second active area are laterally spaced apart by an isolation structure.

5. The integrated circuit of claim 4, wherein said first source and drain regions have a second concentration of n-type dopant species greater than the first concentration of n-type dopant species.

6. The integrated circuit of claim 5, further comprising second source and drain regions arranged within the second active area laterally adjacent the second lightly doped drain areas and having a second concentration of p-type dopant species greater than the first concentration of p-type dopant species, wherein the second source and drain regions are formed aligned with the fourth outer edges of the fourth pair of sidewall spacers.

7. The integrated circuit of claim 1, wherein said first and second pairs of sidewall spacers have a first lateral width that is approximately the same for both said first and second pairs, and wherein said third and fourth pairs of sidewall spacers have a second lateral width that is approximately the same for both said third and fourth pairs.

8. An integrated circuit, comprising:

a first gate conductor laterally spaced from a second gate conductor, wherein said first and second gate conductors each have respective opposed sidewalls, wherein said first and second gate conductors are formed over a semiconductor substrate;

first spacers having first outer edges; wherein one of said first spacers is on each of said opposed sidewalls of said first and second gate conductors;

second spacers having second outer edges, wherein one of said second spacers is on the first outer edge of each of said first spacers;

first source and drain regions within said semiconductor substrate on opposite sides of said first gate conductor, wherein said first source and drain regions are formed aligned at a point between the first and the second outer edges of the first and second spacer respectively on the first gate conductor; and second source and drain regions within said semiconductor substrate on opposite sides of said second gate conductor, wherein said second source and drain regions are formed aligned with the second outer edges of the second spacers on the first outer edges of the first spacers on said second gate conductor.

9. The integrated circuit as recited in claim 8, further comprising lightly doped regions within said semiconductor substrate, wherein said lightly doped regions are formed on opposite sides of said first gate conductor aligned with the opposed sidewalls of said first gate conductor.

10. The integrated circuit as recited in claim 8, further comprising lightly doped regions within said semiconductor substrate, wherein said lightly doped regions are formed on opposite sides of said second gate conductor aligned with the first outer edges of the first spacers on the opposed sidewalls of the second gate conductor.

11. The integrated circuit as recited in claim 8, wherein said first source and drain regions comprise n-type dopants and said second source and drain regions comprise p-type dopants.

12. The integrated circuit as recited in claim 8, wherein said first spacers all have approximately the same lateral width.

13. The integrated circuit as recited in claim 8, wherein said second spacers all have approximately the same lateral width.

14. An integrated circuit, comprising:

a first transistor having a first gate conductor and first lightly doped regions formed within a semiconductor substrate and aligned to opposed sidewalls of the first gate conductor, the first transistor further including a first pair of spacers on the opposed sidewalls of the first gate conductor and first source and drain regions on opposite sides of the first gate conductor and aligned at a point laterally spaced from said outer edges of said first pair of spacers; and a second transistor having a second gate conductor and a second pair of spacers on opposed sidewalls of said second gate conductor, the second transistor further including second lightly doped regions formed within the semiconductor substrate and aligned to outer edges of said second pair of spacers, the second transistor further including a third pair spacers on the outer edges of the second pair of spacers and second source and drain regions formed within the semiconductor substrate aligned to outer edges of the third pair of spacers;

wherein said first source and drain regions are laterally closer to the sidewalls of said first gate conductor than said second source and drain regions are to the sidewalls of said second gate conductor.

15. The integrated circuit as recited in claim 14, wherein said first transistor is an NMOS transistor and said second transistor is a PMOS transistor.

16. The integrated circuit as recited in claim 14, wherein said first pair of spacers and said second pair of spacers all have approximately the same lateral width.

* * * * *

UNITED STATES PATENT AND TRADEMARK OFFICE
CERTIFICATE OF CORRECTION

PATENT NO. : 6,124,610
DATED : September 26, 2000
INVENTOR(S) : Jon D. Cheek, Derick J. Wristers, and Anthony J. Toprac It is certified that error appears in the above-identified patent and that said Letters Patent is hereby corrected as shown below:

In the Claims:
Claim 3, column 9,
Line 22, please delete "1" and insert -- 2 -- in place thereof.

Signed and Sealed this

Eighteenth Day of September, 2001

Attest:

*Attesting Officer*

NICHOLAS P. GODICI
*Acting Director of the United States Patent and Trademark Office*